United States Patent [19]
Kummert

[11] Patent Number: 5,111,418
[45] Date of Patent: May 5, 1992

[54] METHOD AND NETWORK CONFIGURATION FOR OBTAINING THE GRADIENT OF THE OUTPUT SIGNALS OF A GIVEN NETWORK FOR PROCESSING DISCRETE-TIME SIGNALS RELATING TO THE NETWORK PARAMETERS

[75] Inventor: Anton Kummert, Hattingen, Fed. Rep. of Germany

[73] Assignee: Siemens Aktiengesellschaft, Munich, Fed. Rep. of Germany

[21] Appl. No.: 525,163

[22] Filed: May 17, 1990

[30] Foreign Application Priority Data

May 19, 1989 [EP] European Pat. Off. ...... 89-109-086.2

[51] Int. Cl.$^5$ ............................................. G06F 15/31
[52] U.S. Cl. .......................... 364/724.19; 364/724.17
[58] Field of Search ....................... 364/724.19, 724.17, 364/724.01

[56] References Cited

U.S. PATENT DOCUMENTS 4,792,915 12/1988 Adams et al. ................... 364/724.19
4,843,583 6/1989 White et al. ................... 364/724.19

OTHER PUBLICATIONS

ICASSP 88; 11th–14th Apr. 1988; New York; John J. Shynk: "On lattice-form algorithms for adaptive IIR filtering", pp. 1554–1557.
IEEE Transactions on Acoustics, Speech and Signal Processing, vol. ASSP. 30, No. 2, Apr. 1982; New York; I. L. Ayala: "On a New Adaptive Lattice Algorithm for Recursive Filters", pp. 316–319.
IEEE Transactions on Acoustics, Speech and Signal Processing, vol. ASSP. 28, No. 1, Feb. 1980; New York; D. Parikh et al.: "An Adaptive Lattice Algorithm for Recursive Filters", pp. 110–111.
Diss. ETH 5860, Juris Druck and Verlag Zürich, 1977; Stephan Horvath; "Adaptive rekursive Entzerrer für die schnelle Datenübertragung".

Primary Examiner—Tan V. Mai
Attorney, Agent, or Firm—Herbert L. Lerner; Laurence A. Greenberg

[57] ABSTRACT

A method and network configuration obtain a gradient of output signals of a network for processing discrete-time signals with respect to network parameters. The network includes a first subnetwork having only delay-free elements, being acted upon by input signals and emitting output signals, and a second subnetwork having only time-lag elements, receiving signals from the first subnetwork and feeding back the signals with a delay to the first subnetwork. Further output signals are each formed corresponding to the gradient of the output signals with respect to the network parameters. The further output signals are equal to the sum of all of the signals produced by linking all of the input signals, all of the signals delayed by the second subnetwork and all of the network parameters through a first linking function, and of all of the signals being a result of the linkage of all of the input signals, all of the signals delayed by the second subnetwork, and all of the network parameters through a second linking function multiplied by internal signals being delayed in accordance with the second subnetwork. The first linking function is equal to the gradient of a transfer function of the first subnetwork with respect to the network parameters. The second linking function is equal to the gradient of the transfer function of the first subnetwork with respect to the signals delayed by the second subnetwork. The internal signals are equal to the gradient of the signals supplied by the first subnetwork to the second subnetwork with respect to the network parameters.

5 Claims, 6 Drawing Sheets

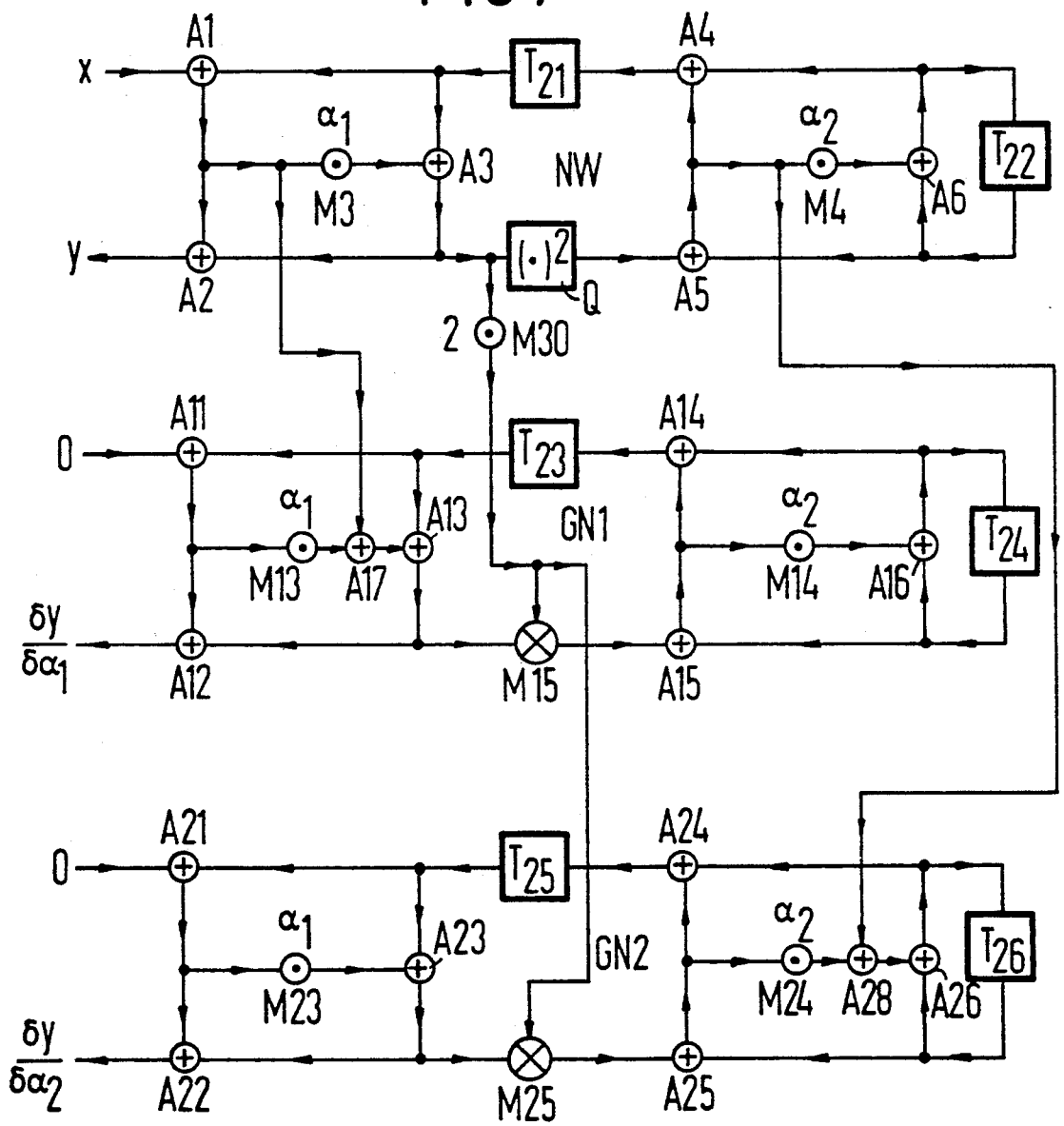

METHOD AND NETWORK CONFIGURATION FOR OBTAINING THE GRADIENT OF THE OUTPUT SIGNALS OF A GIVEN NETWORK FOR PROCESSING DISCRETE-TIME SIGNALS RELATING TO THE NETWORK PARAMETERS

BACKGROUND OF THE INVENTION

1. Field of the Invention

The invention relates to a method and network configuration for obtaining the gradient of the output signals of a given network for processing discrete-time signals relating to network parameters, wherein the network includes a first subnetwork having only delay-free elements, being acted upon by input signals and emitting the output signals, and a second subnetwork having only time-lag elements to which signals from the first subnetwork are supplied and which feeds the signals back to the first subnetwork with a delay.

2. Description of the Related Art.

Adaptive networks, such as adaptive digital filters, are of major significance in many areas of discrete-time signal processing, particularly in the fields of systems analysis, echo compensation in two-wire/four-wire transitions, line distortion correction and speech processing. The characteristic of such adaptive networks, in comparison with constant networks, is that the network parameters that determine the transfer properties are optimally adjusted with respect to a Q function. A Q function of that kind is, for instance, obtained by minimizing the mean quadratic error of the output signal at the adaptive network with respect to a reference signal. For instance, in Optimization Theory with Applications, published by John Wiley and Sons, New York, 1969, D. A. Pierre discloses a method in which the partial derivations (gradient) of the Q function are formed in accordance with the network parameters to be adapted. However, for most quality criteria, that method is traceable to the formation of the partial derivations of the output signal of the adaptive network in accordance with the network parameters.

In non-recursive structures such as finite impulse response filters and transversal filters, the output signal is a linear combination of variously delayed and weighted input signals, and as a result the gradient formation is still relatively easy to perform.

In contrast, in recursive structures, such problems are substantially more complex and have thus far been solved only for very specialized structures, such as is described by S. Horvath in Adaptive rekursive Entzerrer für schnelle Datenübertragung [Adaptive Recursive Distortion Correctors for Fast Data Transfer], ETH Zürich [Engineering College of Zürich], dissertation ETH 5860, 1977, for the cascade circuit of quadratic systems, for first and second canonic structures and for lattice filters, as well as for filters of Gray and Markel structure, as is disclosed, for instance, by D. Parikh, N. Ahmed and S. D. Stearns in IEEE Trans. On Acoustic Speech and Signal Proc., Vol. ASSP-28, No. 1, February 1980. The disadvantages of the known methods are that they are relatively expensive and each is valid only for a specific, very specialized structure.

It is accordingly an object of the invention to provide a method and network configuration for obtaining the gradient of the output signals of a given arbitrary network for processing discrete-time signals relating to the network parameters, which overcomes the hereinafore-mentioned disadvantages of the heretofore-known methods and devices of this general type.

SUMMARY OF THE INVENTION

With the foregoing and other objects in view there is provided, in accordance with the invention, a method for obtaining a gradient of output signals of a network for processing discrete-time signals with respect to network parameters, the network including a first subnetwork having only delay-free elements, being acted upon by input signals and emitting output signals, and a second subnetwork having only time-lag elements, receiving signals from the first subnetwork and feeding back the signals with a delay to the first subnetwork, the method which comprises forming further output signals each corresponding to the gradient of the output signals with respect to the network parameters, setting the further output signals equal to the sum of all of the signals produced by linking all of the input signals, all of the signals delayed by the second subnetwork and all of the network parameters through a first linking function, and of all of the signals being a result of the linkage of all of the input signals, all of the signals delayed by the second subnetwork, and all of the network parameters through a second linking function multiplied by internal signals being delayed in accordance with the second subnetwork; setting the first linking function equal to the gradient of a transfer function of the first subnetwork with respect to the network parameters; setting the second linking function equal to the gradient of the transfer function of the first subnetwork with respect to the signals delayed by the second subnetwork; and setting the internal signals equal to the gradient of the signals supplied by the first subnetwork to the second subnetwork with respect to the network parameters.

With the objects of the invention in view, there is also provided a network configuration, comprising a given network for processing discrete-time signals with respect to network parameters, the given network including a first subnetwork with a transfer function having only delay-free elements, being acted upon by input signals and emitting output signals, and a second subnetwork with a transfer function having only time-lag elements and receiving signals from the first subnetwork and feeding the signals from the first subnetwork back to the first subnetwork with a delay, and a gradient network for obtaining a gradient of the output signals of the given network, the gradient network including a delay-free third subnetwork having an input and being acted upon by the input signals and the signals of the first subnetwork delayed by the second subnetwork, and a fourth subnetwork having only time-lag elements and a transfer function being identical to that of the second subnetwork for receiving signals of the third subnetwork and feeding the signals of the third subnetwork back to the third subnetwork with a delay, the third subnetwork having a transfer function being equal to the sum of the gradient of the transfer function of the first subnetwork with respect to the network parameters and the gradient of the transfer function of the first subnetwork with respect to the signals delayed by the second subnetwork, multiplied by the signals delayed by the fourth subnetwork, and a short circuit at the input of the third subnetwork.

In accordance with another feature of the invention, the network has a linear transfer function, the first subnetwork includes a fifth subnetwork having a transfer function and being dependent on the network parameters referred to the gradient, and a sixth subnetwork having a transfer function and being independent of the network parameters; the third subnetwork includes a seventh subnetwork having a transfer function identical to the fifth subnetwork, and an eighth subnetwork having a transfer function identical to the sixth subnetwork; and there is provided a ninth subnetwork having a transfer function being equal to the gradient of one of the sixth and eighth subnetworks with respect to the network parameters; the sixth subnetwork being acted upon by the input signals and the signals delayed by the second subnetwork, and the sixth subnetwork supplying signals to the second and fifth subnetworks and output signals; and the eighth subnetwork having an input side being acted upon by a short circuit, by signals supplied by the fourth subnetwork, and by a sum of signals of the seventh subnetwork and signals supplied from the fifth to the sixth subnetworks and carried through the ninth subnetwork, and the eighth subnetwork supplying signals to the fourth and seventh subnetworks as well as further output signals.

In accordance with a further feature of the invention, the fifth subnetwork is at least one multiplier multiplying signals supplied by the sixth subnetwork by one network parameter; the seventh subnetwork is at least one multiplier multiplying signals supplied by the eighth subnetwork by one network parameter; and the transfer function of the ninth subnetwork is equal to one.

In accordance with a concomitant feature of the invention, the fifth subnetwork is a first power wave two-gate adaptor, and the seventh subnetwork is a second power wave two-gate adaptor; output signals of the first power wave two-gate adaptor are each supplied respectively additively and subtractively linked with corresponding signals of the second power wave two-gate adaptor to the eighth subnetwork; and the transfer function of the ninth subnetwork is equal to one.

It is an advantage of the invention that the gradient for arbitrary recursive and non-recursive networks can be formed at little expense. Moreover, the method according to the invention is also applicable to non-linear networks which are, for instance, modulators, quantizers or devices for overflow correction.

Other features which are considered as characteristic for the invention are set forth in the appended claims.

Although the invention is illustrated and described herein as embodied in a method and network configuration for obtaining the gradient of the output signals of a given network for processing discrete-time signals relating to the network parameters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is a schematic circuit diagram of an embodiment of a network configuration according to the invention in a non-linear filter having concentric network parameters as the given network.

DESCRIPTION OF THE PREFERRED EMBODIMENT

Figure 1:
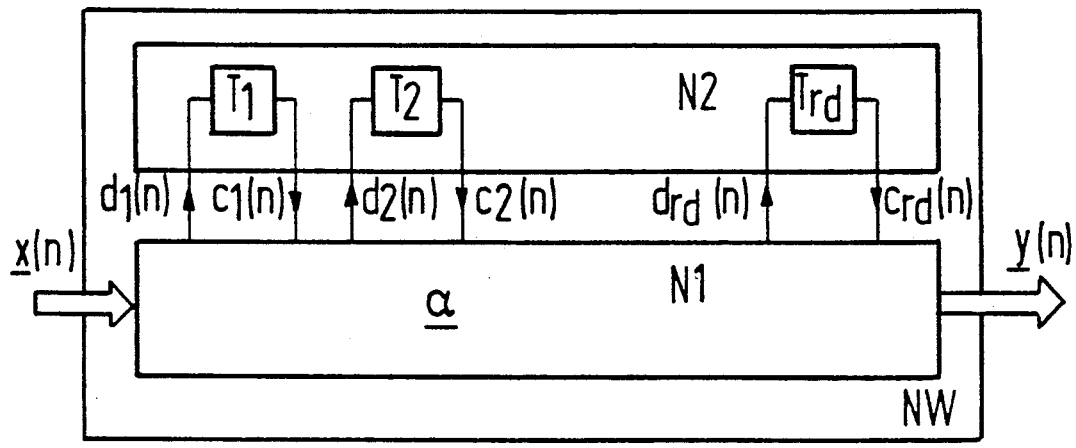
FIG. 1 is block circuit diagram of a given discrete-time network after splitting up into two subnetworks.

Referring now in detail to the figures of the drawing in which identical elements are identified by the same reference numerals and first, particularly, to FIG. 1 thereof, there is seen a given network NW which is acted upon by a number $r_x$ of discrete-time input signals $x_1(n) \ldots x_{rx}(n)$, which in turn emits a number $r_y$ of output signals $y_1(n) \ldots y_{ry}(n)$. These signals are combined below into an input signal vector $x(n)$ and an output signal vector $y(n)$. All of the signals that appear are dependent on a discretized time n.

The transfer behavior of the network NW is the product of the $r_\alpha$ network parameters $\alpha_1, \ldots, \alpha_{r\alpha}$, which are combined into a network parameter vector $\alpha$. The partial derivations of the output signal vector $y(n)$ in accordance with the various network parameters $\alpha_1, \ldots \alpha_{r\alpha}$ $$\frac{\partial y(n)}{\partial \alpha_1}, \ldots, \frac{\partial y(n)}{\partial \alpha_{r\alpha}} \qquad (1)$$

can in turn be described as $r_\alpha$ signal vectors of order $r_y$, which hereinafter are designated as $$y_{\alpha 1}(n) = \frac{\partial y(n)}{\partial \alpha_1}, \ldots, y_{\alpha r\alpha}(n) = \frac{\partial y(n)}{\partial \alpha_{r\alpha}}. \qquad (2)$$

The given network NW is split in accordance with the invention into a first subnetwork N1, including only delay-free elements, and a second subnetwork N2 having solely ideal time-lag elements $T_1, \ldots, T_{rd}$. The first subnetwork N1 emits $r_d$ signals $d_1(n), \ldots, d_{rd}(n)$ to the second subnetwork N2 that are each returned to the first subnetwork N1, after being delayed by a time $k_1, \ldots, k_{rd}$, in the form of signals $c_1(n), \ldots, c_{rd}(n)$. The signals $d_1(n), \ldots d_{rd}(n)$ and $c_1(n), \ldots, c_{rd}(n)$ are hereinafter combined into the respective signal vectors $d(n)$ and $c(n)$. The relationship between the two signal vectors $d(n)$ and $c(n)$ can be represented by the following relationship:

$$\begin{bmatrix} c_1(n) \\ c_2(n) \\ \cdot \\ \cdot \\ \cdot \\ c_{rd}(n) \end{bmatrix} = \begin{bmatrix} d_1(n-k_1) \\ d_2(n-k_2) \\ \cdot \\ \cdot \\ \cdot \\ d_{rd}(n-k_{rd}) \end{bmatrix} \quad (3)$$

The first subnetwork N1 is additionally acted upon by the input signal vector x(n) and carries the output signal vector y(n). Since the first subnetwork N1 is delay-free, its transfer behavior can be described directly by a transfer function h as a function of the input signal vector x(n), the network parameter vector $\alpha$ and the signal vector c(n).

$$\begin{bmatrix} y(n) \\ d(n) \end{bmatrix} = h(x(n), c(n), \alpha). \quad (4)$$

From equations (3) and (4), for the partial derivations $c_{1\alpha i}(n), \ldots, c_{rd\alpha i}(n)$ of the signal vector c(n), in accordance with a predetermined parameter i, it follows that:

$$\begin{bmatrix} c_{1\alpha i}(n) \\ c_{2\alpha i}(n) \\ \cdot \\ \cdot \\ \cdot \\ c_{rd\alpha i}(n) \end{bmatrix} = \begin{bmatrix} d_{1\alpha i}(n-k_1) \\ d_{2\alpha i}(n-k_2) \\ \cdot \\ \cdot \\ \cdot \\ d_{rd\alpha i}(n-k_{rd}) \end{bmatrix} \quad (5)$$

from which a transfer behavior is obtained that formally describes the partial derivations $y_{\alpha i}(n)$ and $d_{\alpha i}(n)$ of the output signal vector y(n) or of the signal vector d(n) in accordance with a predetermined network parameter $\alpha_i$ as follows:

$$\begin{bmatrix} y_{\alpha i}(n) \\ d_{\alpha i}(n) \end{bmatrix} = \sum_{j=1}^{rd} h_{cj}(x(n), c(n), \alpha) c_{j\alpha i}(n) + h_{\alpha i}(x(n), c(n), \alpha). \quad (6)$$

The partial derivations $y_{\alpha i}(n)$ and $d_{\alpha i}(n)$ are accordingly equal to the sum of all of the signals that are obtained from the multiplication of the partial derivations $c_{\alpha i}(n)$ by a transfer function $h_{cj}$ dependent on the signal vectors x(n), c(n) and the network parameter vector $\alpha$, and all of the signals that are obtained from the linkage of the signals vectors x(n) and c(n) and of the network parameter vector $\alpha$ through a transfer function $h_{\alpha i}$. The transfer function or functions $h_{cj}$ are the product of the partial derivations of the transfer function h in accordance with the signals $c_1(n), \ldots c_{rd}(n)$, and the transfer function $h_{\alpha i}$ is the product of the partial derivation of the transfer function h in accordance with the predetermined network parameter $\alpha_i$. The partial derivation of the input signal vector x(n) in accordance with the predetermined network parameter $\alpha_i$ is equal to zero, since the input signal vector x(n) is not dependent on the predetermined network parameter $\alpha_i$.

Figure 2:
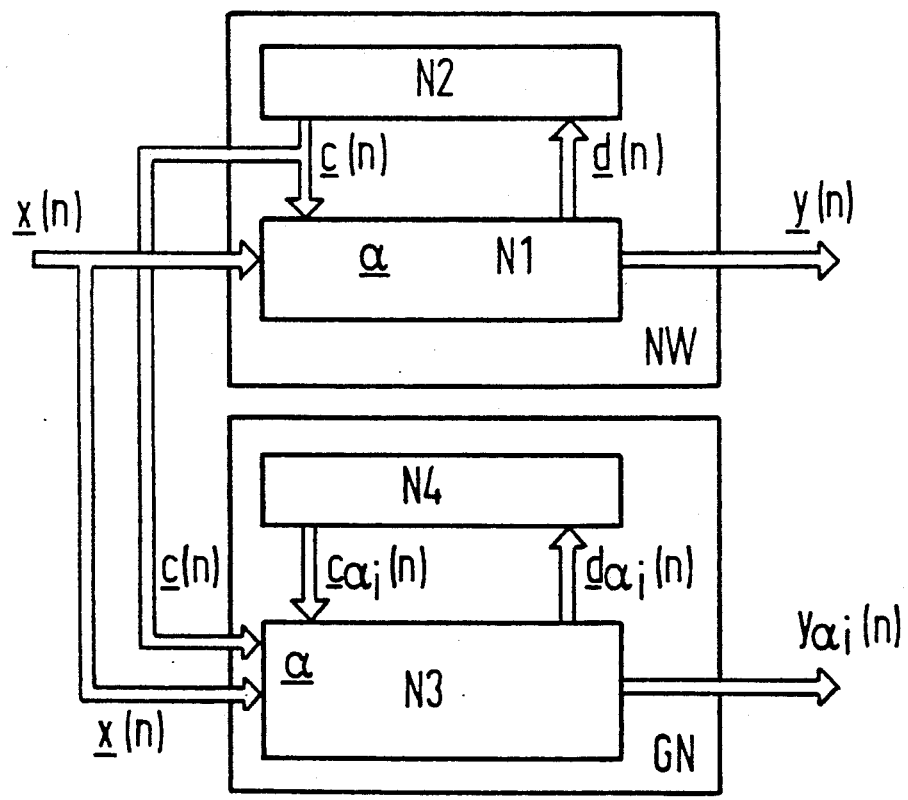
FIG. 2 is a block circuit diagram of a basic embodiment of a network configuration according to the invention.

Accordingly, a third subnetwork N3 is thereby formed as seen in FIG. 2, having a transfer function g which is apparent from equation (6). It thus follows, for the transfer function g as a function of the input signal vector x(n), the signal vector c(n), the signal vector c(n), the signal vector $c_{\alpha i}(n)$ of the signals $c_{1\alpha i}(n), \ldots , c_{rd\alpha i}(n)$, and the network parameter vector $\alpha$:

$$g(x(n), c(n), c_{\alpha i}(n), \alpha) = \quad (7)$$
$$\sum_{j=1}^{rd} h_{cj}(x(n), c(n), \alpha) c_{j\alpha i}(n) + h_{\alpha i}(x(n), c(n), \alpha).$$

The partial derivations of the output signal vector y(n) are obtained for the first subnetwork N1 by the predetermined network parameter $\alpha_i$ as the output signal $y_{\alpha i}(n)$ of the third subnetwork N3. Moreover, the third subnetwork N3 emits the signal vector $d_{\alpha i}(n)$ to a fourth network N4, which is identical in terms of its transfer function to the second network N2. The third subnetwork N3 receives the signal vector $c_{\alpha i}(n)$ from the fourth network N4 and receives the signal vector c(n) from the second network N2.

A basic embodiment of a network configuration for performing the method is illustrated in FIG. 2 of the drawing. In this embodiment, the given network NW of FIG. 1 is split into the first and second subnetworks N1, N2. The two subnetworks N1 and N3 are connected to one another through lines which transmit the signals each being joined to make the signal vectors d(n) and c(n). The first subnetwork N1 is additionally acted upon by the input signal vector x(n) and its output carries the output signal vector y(n). All of the network parameters of the network NW are joined in the first subnetwork N1.

According to the invention, a gradient network GN is provided which can likewise be spilt into two subnetworks, namely the third and fourth subnetworks N3 and N4. The fourth subnetwork N4 is equivalent to the second subnetwork N2 in terms of its transfer properties. The two subnetworks N3 and N4 are connected to one another through lines on which the signal vectors $d_{\alpha i}(n)$ and $c_{\alpha i}(n)$ are transmitted. The third subnetwork N3 is also acted upon by the input signal vector x(n) and the signal vector c(n), and at its output carries the output signal vector $y_{\alpha i}(n)$. The transfer function g of the third subnetwork N3, like the transfer function h of the first subnetwork N1, is dependent on the network parameter vector $\alpha$ and is formally expressed in equation (7).

The advantages of the method which has been presented as well as of the network configuration for performing the method, is accordingly that only the synthesis of the third subnetwork N3 is required, since the second and fourth subnetworks are essentially identical in terms of transfer behavior and structure. This is particularly advantageous if partial derivations of the output signal vector y(n) in accordance with further network parameters are necessary. The derivations in accordance with further parameters are obtained analogously.

Figure 3:
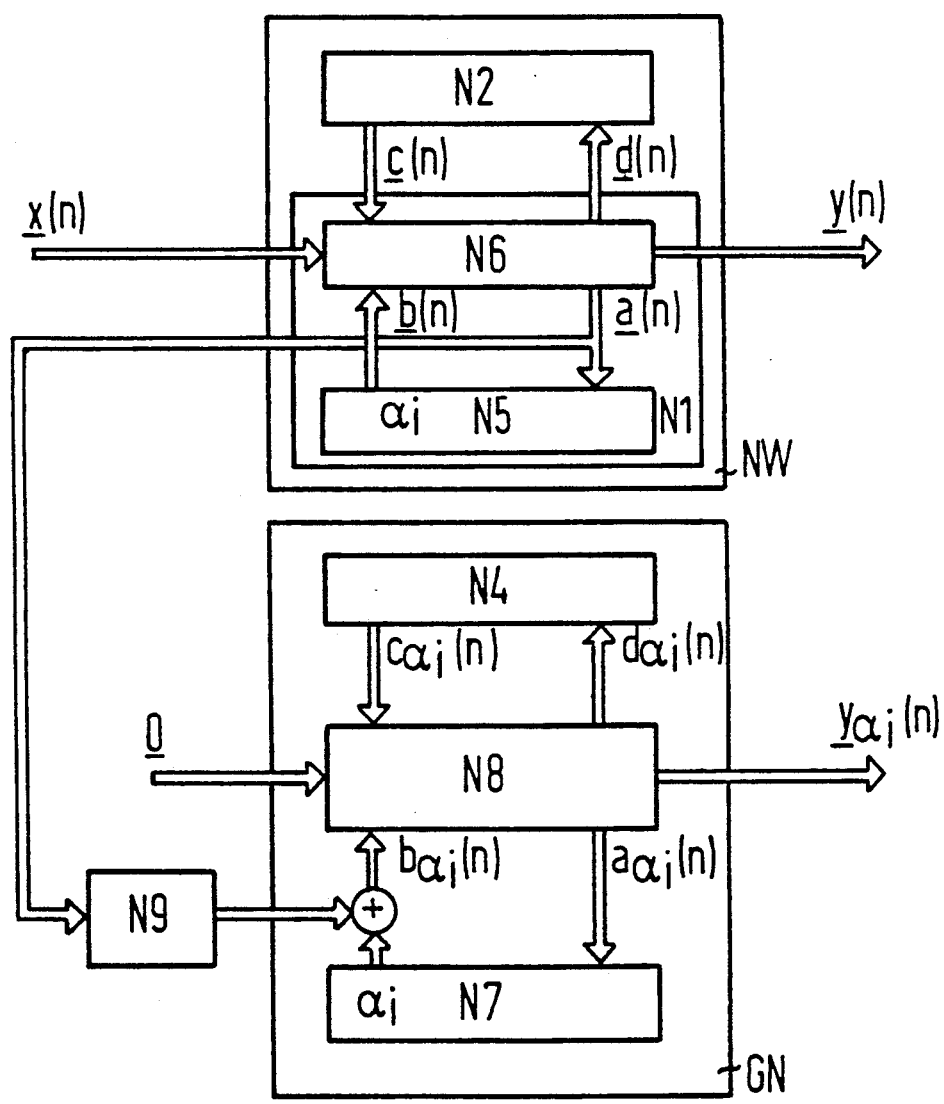
FIG. 3 is a block circuit diagram of a basic embodiment of a network configuration according to the invention with a given linear network.

In the embodiment of FIG. 3, the given network NW has a linear transfer behavior. Besides splitting into the two subnetworks N1 and N2, a further splitting of the delay-free first subnetwork N1 into a fifth subnetwork N5 that contains only elements dependent on the predetermined network parameter $\alpha_i$, and a sixth subnetwork N6 that contains only elements independent of the predetermined network parameter $\alpha_i$, is provided. Signals which are joined by the sixth subnetwork N6 to make a signal vector a(n) are fed to the fifth subnetwork N5, and signals which are joined by the fifth subnetwork N5 to make a signal vector b(n) are fed to the sixth subnetwork N6.

The transfer of the subnetworks N6 and N5 can be described by two transfer matrices $H_6$ and $H_5(\alpha_i)$. The result obtained for the sixth subnetwork N6 is:

$$\begin{bmatrix} y(n) \\ d(n) \\ a(n) \end{bmatrix} = H_4 \begin{bmatrix} x(n) \\ c(n) \\ b(n) \end{bmatrix} \quad (8)$$

and for the fifth subnetwork N5 is:

$$b(n) = H_5(\alpha_i) a(n). \quad (9)$$

By derivation of equations (8) and (9) in accordance with the predetermined network parameter $\alpha_i$, $$\begin{bmatrix} y_{\alpha_i}(n) \\ d_{\alpha_i}(n) \\ a_{\alpha_i}(n) \end{bmatrix} = H_4 \begin{bmatrix} 0 \\ c_{\alpha_i}(n) \\ b_{\alpha_i}(n) \end{bmatrix} \quad (10)$$

and $$b_{\alpha_i}(n) = H_5(\alpha_i) a_{\alpha_i}(n) + \frac{\partial H_5(\alpha_i)}{\partial \alpha_i} a(n). \quad (11)$$

The gradient network GN can be split in a manner corresponding to the third subnetwork N3 into a seventh subnetwork N7 containing only elements dependent on the predetermined network parameter $\alpha_i$, and an eighth subnetwork containing elements independent thereof. By introducing a ninth subnetwork N9 having the transfer network $H_9 = \partial H_5(\alpha i)/\partial \alpha_i$, which is accordingly equal to the derivation of the transfer-function matrix $H_5(\alpha_i)$ of the fifth subnetwork N5 in accordance with the predetermined network parameter $\alpha_i$, a virtually identical structure of the given network NW and the gradient network GN is obtained. The transfer behaviors of the eighth subnetwork N8 and of the seventh subnetwork N7 are described by the transfer-function matrices $H_4$ and $H_5(\alpha_i)$.

The differences are solely that the sixth subnetwork N6 is acted upon by the input signal vector x(n), while in contrast the eighth subnetwork N8, which corresponds to the sixth, is acted upon by a zero vector 0, and that the signal vector a(n) transferred through the ninth subnetwork N9 is additively linked with the signal vector fed back by the seventh subnetwork N7 to the eighth subnetwork N8.

The advantage is that the synthesis of only the ninth subnetwork N9 is then necessary because the second and fourth subnetworks N2 and N4, the fifth and seventh subnetworks N5 and N7, and the sixth and eighth subnetworks N6 and N8 are each identical to one another in transfer behavior and structure.

Figure 4:
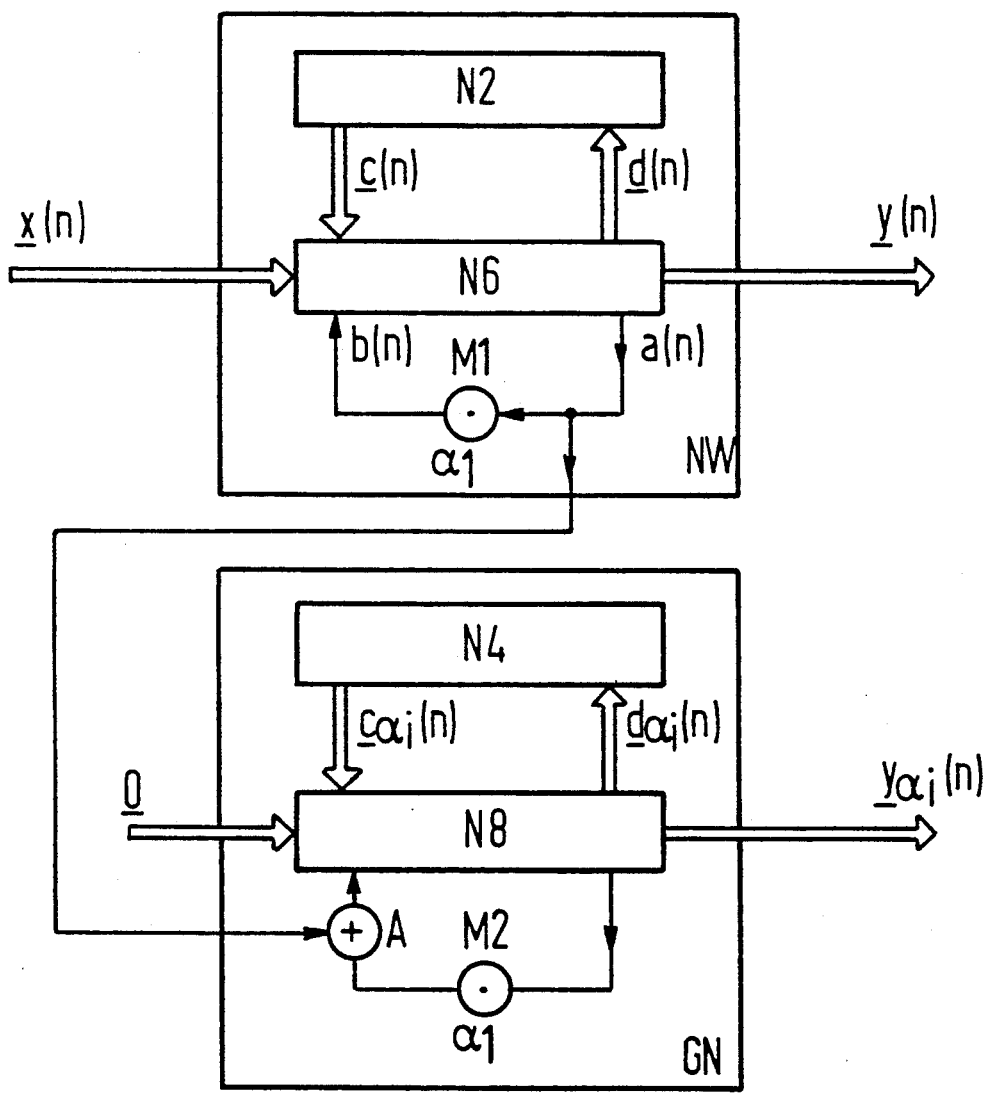
FIG. 4 is a block circuit diagram of a basic embodiment of a network configuration according to the invention with concentric parameters.

In the exemplary embodiment of FIG. 4, as compared with FIG. 3, the predetermined network parameter $\alpha_i$ is defined by a multiplier coefficient $\alpha_1$. The fifth subnetwork N5 is thus reduced to a multiplier M1. Its transfer behavior is then determined by the fact that a signal a(n) supplied by the sixth subnetwork N6 is multiplied by the coefficient $\alpha_1$ and fed back as the signal b(n) to the sixth subnetwork N6. The seventh subnetwork N7 is likewise formed by a multiplier M2, the output signal of which is additively linked by means of an adder A to the signal a(n) transferred by a ninth subnetwork N9 seen in FIG. 3 and is fed back to the eighth subnetwork N8.

The transfer behavior of the ninth subnetwork N9 arises from the fact that the signal b(n), like the signal a(n), is multiplied by the coefficient $\alpha_1$, and thus the transfer function of the fifth subnetwork $H_5$ is equal to the coefficient $\alpha_1$, or for the transfer function $H_9$ in total:

$$\frac{\partial H_5(\alpha_i)}{\partial \alpha_i} = 1. \quad (12)$$

Thus as shown in FIG. 4, the ninth subnetwork N9 can be replaced by a line.

This has the advantage of ensuring that the given network NW and the gradient network GN are essentially identical in structure and transfer behavior, and that the signal a(n) is nearly removed prior to the multiplier M1 and added to the output of the multiplier M2.

Figure 5:
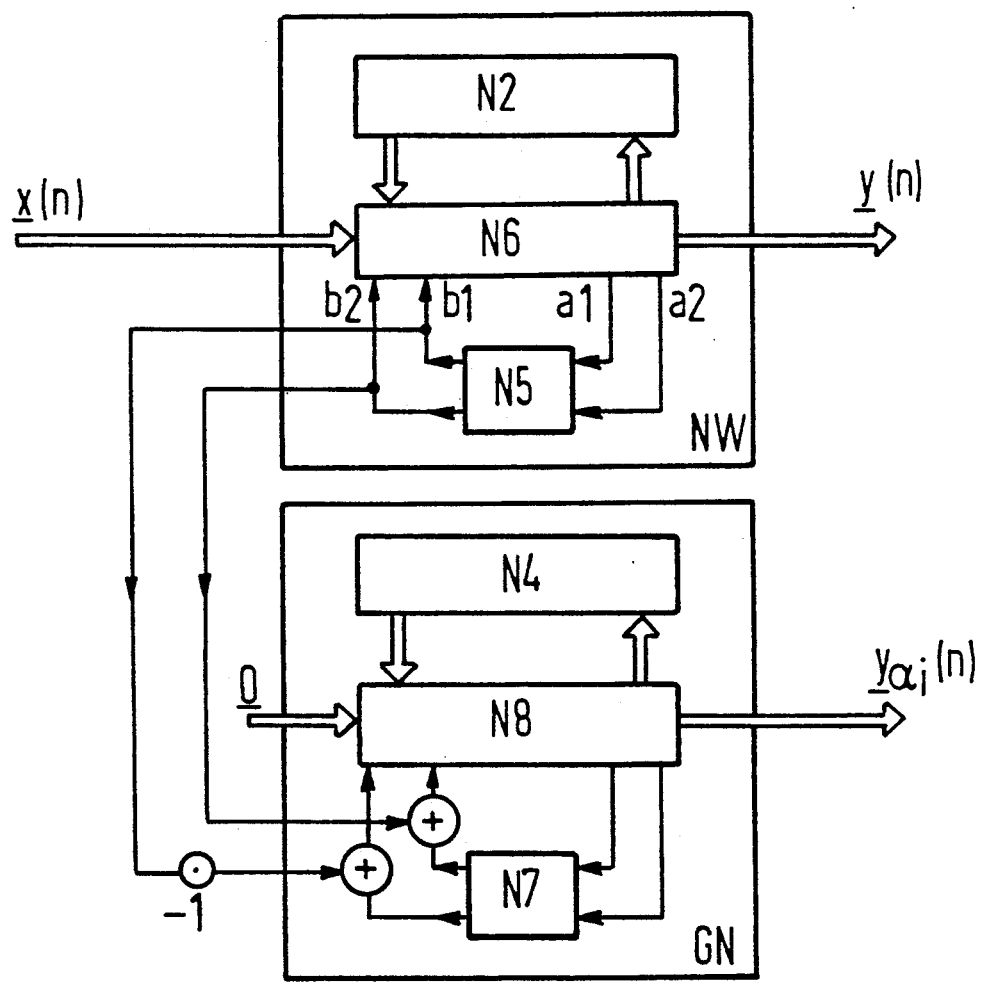
FIG. 5 is a block circuit diagram of a basic embodiment of a network configuration according to the invention with power wave two-gate adaptors.

In the exemplary embodiment of FIG. 5, as compared with FIG. 3, a first power wave two-gate adaptor is provided as the linear fifth subnetwork N5 and a second power wave two-gate adaptor is provided as the seventh subnetwork N7. In this case, the transfer-function matrix $H_5$ of the fifth subnetwork N5 is obtained as a function of the predetermined network parameter as follows:

$$H_5(\alpha) = \begin{bmatrix} \sin \alpha_i & \cos \alpha_i \\ \cos \alpha_i & -\sin \alpha_i \end{bmatrix} \quad (13)$$

from which it follows for the transfer-function matrix $H_9$ of the ninth subnetwork N9 that $$H_9 = \frac{\partial H_5(\alpha_i)}{\partial \alpha_i} = \begin{bmatrix} \cos \alpha_i & -\sin \alpha_i \\ -\sin \alpha_i & -\cos \alpha_i \end{bmatrix} \quad (14)$$

Thus once again the given network NW and the gradient network GN are essentially identical, and the ninth subnetwork N9 is constructed as a line, because instead of once again carrying the signals $a_1$ and $a_2$ over a ninth subnetwork N9 with a transfer-function matrix $H_9$, the output signals $b_1$ and $b_2$ of the fifth subnetwork N5 are then respectively linked to the output signals of the seventh subnetwork N7 additively and subtractively instead of only additively. As a result, the transfer behavior of a line is obtained for the ninth subnetwork N9.

The corresponding output signals $b_1$ and $b_2$ of the fifth subnetwork N5 need merely be respectively linked to the output signals of the seventh subnetwork N7 subtractively and additively.

Figure 6:
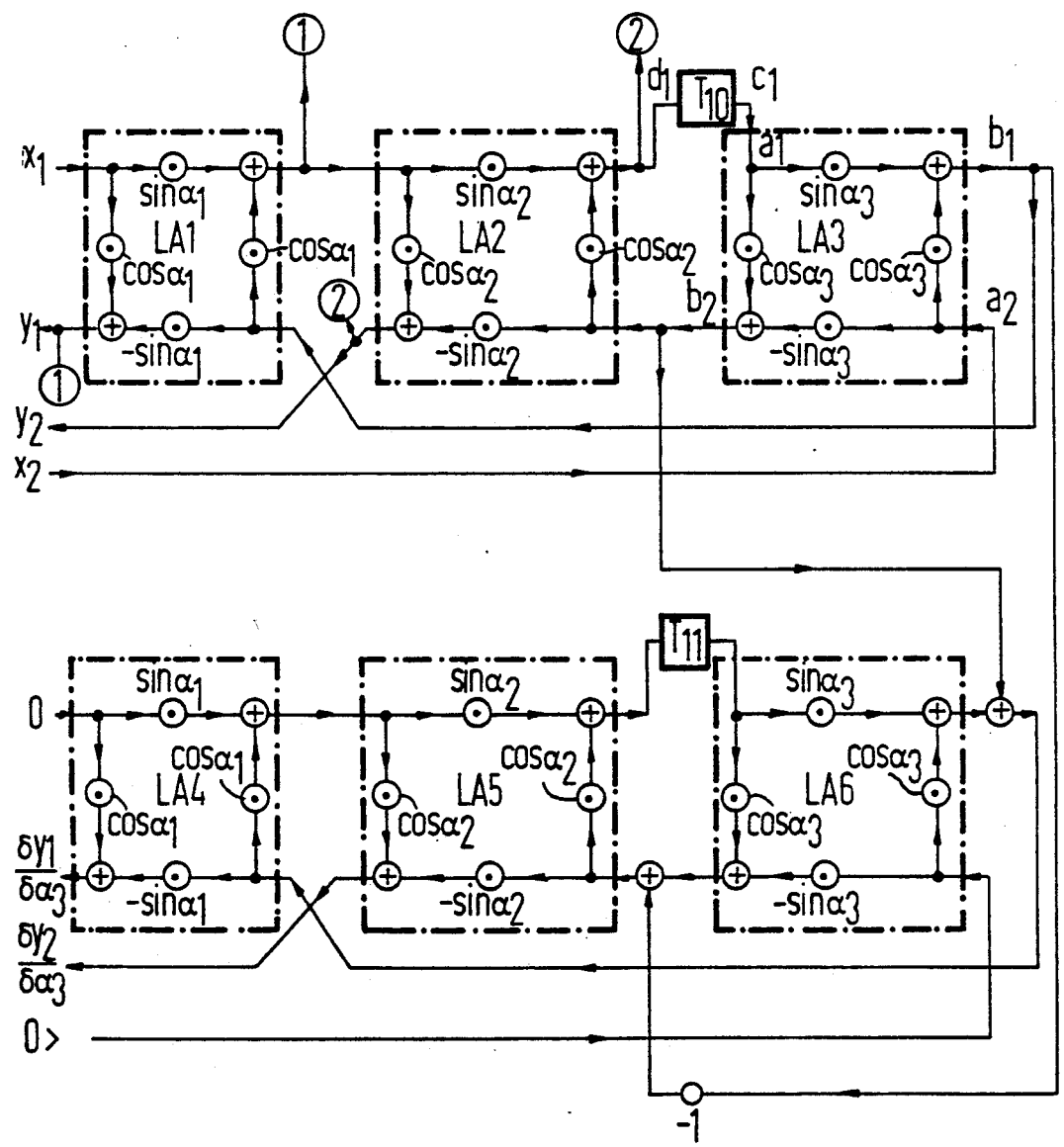
FIG. 6 is a schematic circuit diagram of an embodiment of a network configuration according to the invention having a digital wave filter with distributed network parameters as the given network.

In FIG. 6 of the drawing, a linear power wave digital filter with distributed network parameters $\alpha_1$, $\alpha_2$ and $\alpha_3$ is shown. The filter includes a time-lag element $T_{10}$ and three power wave two-gate adaptors LA1, LA2, LA3, having the parameters $\alpha_1$, $\alpha_2$, $\alpha_3$. Each of the power wave two-gate adaptors include four multipliers as well as two inputs and two outputs. One input, hereinafter called the forward input, is connected first to a first multiplier, which is provided for multiplication by a variable $\sin \alpha_i$, and second to a second multiplier, which is provided for multiplication by a variable $\cos\alpha_i$. The other input, hereinafter called the backward input, is connected first to a third multiplier, which is provided for multiplication by a variable $-\sin\alpha_i$, and second to a fourth multiplier, which is provided for multiplication by the variable $\cos\alpha_i$. The outputs of the first and fourth multipliers are followed by an adder which leads to one output of the power wave two-gate adaptor, hereinafter called the forward output. Likewise, the outputs of the second and third multipliers are followed by a further adder, which leads to a further output hereinafter called the backward output, of the power wave two-gate adaptor.

In the power wave digital filter shown, the forward output of the first power wave two-gate adaptor LA1 is connected to the forward input of the second power wave two-gate adaptor LA2, which has a forward output that is in turn is coupled through the time-lag element $T_{10}$ to the forward input of the third power wave two-gate adaptor LA3. Additionally, the backward output of the third power wave two-gate adaptor LA3 is carried to the backward input of the second power wave two-gate adaptor LA2, and the forward output of the third two-gate adaptor LA3 is carried to the backward input of the first two-gate adaptor LA1. Input signals $x_1$ and $x_2$ are respectively present at the forward input of the first power wave two-gate adaptor LA1 and at the backward input of the third power wave two-gate adaptor LA3, and output signals $y_1$ and $y_2$ are respectively received from the backward output of the first power wave two-gate adaptor LA1 and the backward output of the second power wave two-gate adaptor LA2. In order to obtain the gradient in accordance with the parameter $\alpha_3$ of this network, a network identical to this one is provided, having three power wave two-gate adaptors LA4, LA5, LA6 with the parameters $\alpha_1$, $\alpha_2$, $\alpha_3$, and a time-lag element $T_{11}$. This gradient network is not acted upon by the input signals $x_1$ and $x_2$ but instead in each case with a short circuit 0. The coupling of the two networks is effected first by addition of the signals at the backward output of the third power wave two-gate adaptor LA3 and the forward output of the sixth power wave two-gate adaptor LA6, and second by subtraction of the signal at the forward output of the third power wave two-gate adaptor LA3 from the signal at the backward output of the sixth power wave two-gate adaptor LA6. Thus instead of the output signals $y_1$ and $y_2$, the partial derivations of these signals $\partial y_1/\partial\alpha_3$ and $\partial y_2/\partial\alpha_3$ thus appear at the corresponding outputs.

In order to obtain the derivations of the signals $y_1$ and $y_2$ in accordance with the respective parameters $\alpha_1$ and $\alpha_2$, one further identically constructed gradient network each is needed. The coupling of these gradient networks is effected similarly to the power wave two-gate adaptors LA3 and LA6 at the parameter $\alpha_3$ for the parameters $\alpha_1$ and $\alpha_2$, based on corresponding locations 1 and 2 of the power wave two-gate adaptors LA1 and LA2 in the respective gradient filter at the proper point.

FIG. 7 of the drawing shows an exemplary embodiment in the form of a given non-linear filter having the concentric parameters $\alpha_1$ and $\alpha_2$. An input signal x is linked by an adder A1 to the output signal of a time-lag element $T_{21}$. The output of the adder A1 is carried first to a multiplier M3 for multiplication by the parameter $\alpha_1$ and second to an adder A2 at the output of which an output signal y appears. The input side of the adder A2 is additionally connected to the output of an adder A3.

One input of the adder A3 is in turn connected to the output of the multiplier M3 and the other input thereof is connected to the output of the time-lag element $T_{21}$. The input of the time-lag element $T_{21}$ is acted upon by the output signal of an adder A4, which is triggered on the input side thereof by an adder A5 and an adder A6. The input side of the adder A6 in turn is coupled first with the output of a time-lag element $T_{22}$ having an input which is wired to the output of the adder A6, and second through a multiplier M4, for multiplication by the parameter $\alpha_2$, with the output of the adder A5. One input of the adder A5 is connected to the output of the time-lag element $T_{22}$, and the other input is connected to the output of a non-linear element, namely a square-law transfer element Q.

In order to obtain the gradient $\partial y/\partial\alpha_1$ and $\partial y/\partial\alpha_2$ of the output signal y of this filter in accordance with the respective parameters $\alpha_1$ and $\alpha_2$, one gradient network GN1 and GN2 having respective adders A11–A16 and A21–A26, respective multipliers M13–M14 and M23–M24 and respective time-lag elements $T_{23}$–$T_{24}$ and $T_{25}$–$T_{26}$, is provided for each. The two networks have a virtually identical structure in terms of the filter. The only changes are that in the two networks, a respective multiplier M15 and M25 replaces the square-law transfer element Q. Furthermore, in the gradient network GN1, the multiplier M13 for multiplication by the parameter $\alpha_1$ is followed by an adder A17, and in the gradient network GN2, the multiplier M24 for multiplication by the parameter $\alpha_2$ is followed by an adder A28. The other inputs of the respective adders A17 and A28 are acted upon by the input signals of the respective multipliers M3 and M4. Finally, the remaining inputs of the multipliers M15 and M25 are joined and connected to the output of the adder A1, through a multiplier M30 for multiplication by 2. The inputs of the gradient networks GN1 and GN2 equivalent to the input of the filter NW, are not acted upon by any signal (as seen by reference numeral 0).

As has been shown, the method presented is applicable to arbitrary networks, including not only linear but non-linear networks as well. This is very advantageous, because linear networks can sometimes exhibit non-linear behavior, for example as a result of rounding characteristics or an overflow. This method is preferably furthermore used in recursive structures, such as digital wave filters.

I claim:

1. Method for obtaining a gradient of output signals of a network for processing discrete-time signals with respect to network parameters, the network including a first subnetwork having only delay-free elements, being acted upon by input signals and emitting output signals, and a second subnetwork having only time-lag elements, receiving signals from the first subnetwork and feeding back the signals with a delay to the first subnetwork, the method which comprises forming further output signals each corresponding to the gradient of the output signals with respect to the network parameters, setting the further output signals equal to the sum of all of the signals produced by linking all of the input signals, all of the signals delayed by the second subnetwork and all of the network parameters through a first linking function, and of all of the signals being a result of the linkage of all of the input signals, all of the signals delayed by the second subnetwork, and all of the network parameters through a second linking function multiplied by internal signals being delayed in accordance with the second subnetwork;

setting the first linking function equal to the gradient of a transfer function of the first subnetwork with respect to the network parameters;

setting the second linking function equal to the gradient of the transfer function of the first subnetwork with respect to the signals delayed by the second subnetwork; and setting the internal signals equal to the gradient of the signals supplied by the first subnetwork to the second subnetwork with respect to the network parameters.

2. Network configuration, comprising:

a given network for processing discrete-time signals with respect to network parameters, said given network including:

a first subnetwork with a transfer function having only delay-free elements, being acted upon by input signals and emitting output signals, and a second subnetwork with a transfer function having only time-lag elements and receiving signals from said first subnetwork and feeding the signals from said first subnetwork back to said first subnetwork with a delay, and a gradient network for obtaining a gradient of the output signals of said given network, said gradient network including:

a delay-free third subnetwork having an input and being acted upon by the input signals and the signals of said first subnetwork delayed by said second subnetwork, and a fourth subnetwork having only time-lag elements and a transfer function being identical to that of said second subnetwork for receiving signals of said third subnetwork and feeding the signals of said third subnetwork back to said third subnetwork with a delay, said third subnetwork having a transfer function being equal to the sum of the gradient of the transfer function of said first subnetwork with respect to the network parameters and the gradient of the transfer function of said first subnetwork with respect to the signals delayed by said second subnetwork, multiplied by the signals delayed by said fourth subnetwork, and a short circuit at the input of said third subnetwork.

3. Network configuration according to claim 2, wherein said network has a linear transfer function, said first subnetwork includes a fifth subnetwork having a transfer function and being dependent on the network parameters referred to the gradient, and a sixth subnetwork having a transfer function and being independent of the network parameters;

said third subnetwork includes a seventh subnetwork having a transfer function identical to said fifth subnetwork, and an eighth subnetwork having a transfer function identical to said sixth subnetwork; and including a ninth subnetwork having a transfer function being equal to the gradient of one of said sixth and eighth subnetworks with respect to the network parameters;

said sixth subnetwork being acted upon by the input signals and the signals delayed by said second subnetwork, and said sixth subnetwork supplying signals to said second and fifth subnetworks and output signals; and said eighth subnetwork having an input side being acted upon by a short circuit, by signals supplied by said fourth subnetwork, and by a sum of signals of said seventh subnetwork and signals supplied from said sixth to said fifth subnetworks and carried through said ninth subnetwork, and said eighth subnetwork supplying signals to said fourth and seventh subnetworks as well as further output signals.

4. Network configuration according to claim 3, wherein said fifth subnetwork is at least one multiplier multiplying signals supplied by said sixth subnetwork by one network parameter; said seventh subnetwork is at least one multiplier multiplying signals supplied by said eighth subnetwork by one network parameter; and the transfer function of said ninth subnetwork is equal to one.

5. Network configuration according to claim 3, wherein said fifth subnetwork is a first power wave two-gate adaptor, and said seventh subnetwork is a second power wave two-gate adaptor; output signals of said first power wave two-gate adaptor are each supplied respectively additively and subtractively linked with corresponding signals of said second power wave two-gate adaptor to said eighth subnetwork; and the transfer function of said ninth subnetwork is equal to one.

* * * * *